US007919823B2

(12) United States Patent
Sato et al.

(10) Patent No.: US 7,919,823 B2
(45) Date of Patent: Apr. 5, 2011

(54) EEPROM ARRAY WITH WELL CONTACTS

(75) Inventors: Atsuhiro Sato, Yokohama (JP); Kikuko Sugimae, Yokohama (JP); Masayuki Ichige, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 12/716,322

(22) Filed: Mar. 3, 2010

(65) Prior Publication Data
US 2010/0155814 A1 Jun. 24, 2010

Related U.S. Application Data

(60) Division of application No. 11/567,805, filed on Dec. 7, 2006, now Pat. No. 7,692,252, which is a continuation of application No. PCT/JP2005/017206, filed on Sep. 12, 2005.

(30) Foreign Application Priority Data

Mar. 31, 2005 (JP) ................................. 2005-100955

(51) Int. Cl.
*H01L 29/24* (2006.01)
*G11C 16/04* (2006.01)
(52) U.S. Cl. ........ 257/390; 257/318; 257/321; 257/368; 257/369; 257/E21.682; 257/E21.69; 257/E27.103; 365/185.11; 365/185.17

(58) Field of Classification Search .................. 257/318, 257/321, 368, 369, 390, E21.682, E21.69, 257/E27.103; 365/185.11, 185.17
See application file for complete search history.

(56) References Cited

U.S. PATENT DOCUMENTS

| 5,745,417 | A | 4/1998 | Kobayashi et al. | |
|---|---|---|---|---|
| 5,973,374 | A | 10/1999 | Longcor et al. | |
| 6,353,242 | B1 | 3/2002 | Watanabe et al. | |
| 6,483,749 | B1 | 11/2002 | Choi et al. | |
| 6,847,087 | B2 * | 1/2005 | Yang et al. | 257/390 |
| 7,388,783 | B2 * | 6/2008 | Sakui | 365/185.11 |
| 7,400,534 | B2 * | 7/2008 | Maejima | 365/185.17 |
| 2003/0107055 | A1 | 6/2003 | Watanabe et al. | |

FOREIGN PATENT DOCUMENTS

| JP | 2000-91546 A | 3/2000 |
|---|---|---|
| JP | 2001-110920 | 4/2001 |

* cited by examiner

*Primary Examiner* — Dao H Nguyen
(74) *Attorney, Agent, or Firm* — Oblon, Spivak, McClelland, Maier & Neustadt, L.L.P.

(57) ABSTRACT

A semiconductor integrated circuit device includes a cell well, a memory cell array formed on the cell well and having a memory cell area and cell well contact area, first wiring bodies arranged in the memory cell area, and second wiring bodies arranged in the cell well contact area. The layout pattern of the second wiring bodies is the same as the layout pattern of the first wiring bodies. The cell well contact area comprises cell well contacts that have the same dopant type as the cell well and that function as source/drain regions of dummy transistors formed in the cell well contact area.

13 Claims, 12 Drawing Sheets

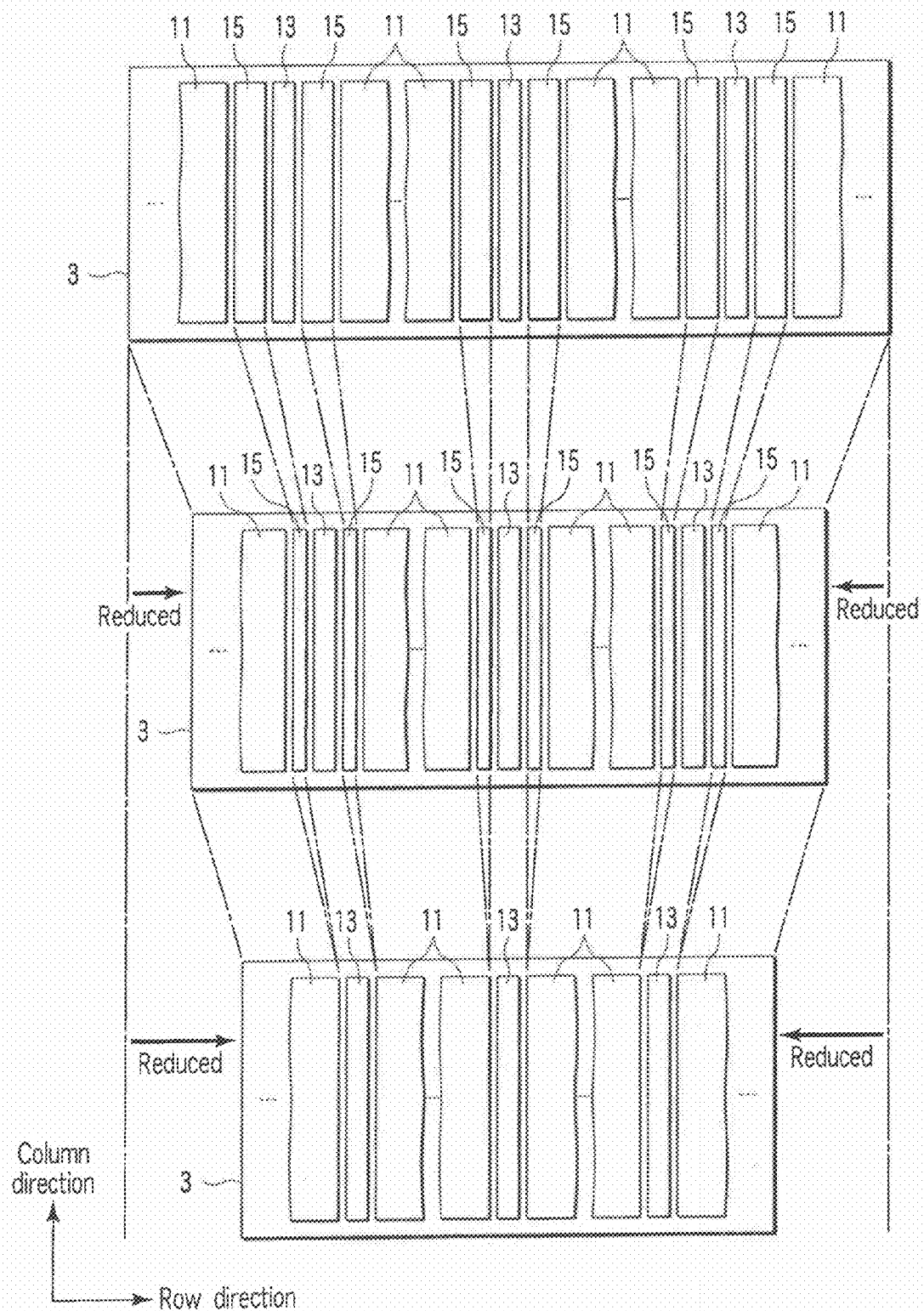
F I G. 11

EEPROM ARRAY WITH WELL CONTACTS

CROSS REFERENCE TO RELATED APPLICATIONS

This application is a divisional of and claims the benefit of priority under 35 U.S.C. §120 from U.S. application Ser. No. 11/567,805, filed on Dec. 7, 2006, which is a Continuation Application of PCT Application No. PCT/JP2005/017206, filed Sep. 12, 2005, which was published under PCT Article 21(2) in English.

This application is based upon and claims the benefit of priority from prior Japanese Patent Application No. 2005-100955, filed Mar. 31, 2005, the entire contents of which are incorporated herein by reference.

BACKGROUND OF THE INVENTION

1. Field of the Invention

This invention relates to a semiconductor integrated circuit device and more particularly to a semiconductor integrated circuit device having a nonvolatile semiconductor memory.

2. Description of the Related Art

EEPROMs are known as semiconductor memories, for example, nonvolatile semiconductor memories. Some EEPROMs have wells whose potential can be changed and memory cell transistors formed on the wells. As a representative example thereof, a flash memory, for example, a NAND flash memory in which data in a plurality of memory cell transistors are simultaneously erased is provided.

Each memory cell transistor of the NAND flash memory has a charge storage layer, for example, a floating gate. The level of the threshold voltage of the memory cell transistor varies according to the amount of charge stored in the floating gate. Data is set and stored according to the level of the threshold voltage.

When data is erased in the NAND flash memory, positive potential is applied to a well called a cell well. Further, when data is written or read out, the potential of the cell well is set to zero, for example.

Thus, the potential of the cell well of the NAND flash memory is changed according to the operation thereof. Therefore, the cell well is connected to a cell well bias circuit which applies the potential corresponding to the operation to the cell well. The potential generated from the cell well bias circuit is supplied to a memory cell array via a cell well bias line and applied to the cell well via a cell well contact. Some cell well lines are laid out parallel to bit lines in the memory cell array, for example, and some cell well contacts are arranged under the cell well bias lines in the memory cell array.

Wiring bodies such as the bit lines, word lines, block selection lines and floating gates are laid out in a repetitive form in the memory cell array. However, the repetitive arrangement cannot be maintained in the portions of the cell well bias lines and cell well contacts. A NAND flash memory having a layout pattern in which the repetitive arrangement is partially lost is described in Jpn. Pat. Appln. KOKAI Publication No. 2000-91546.

BRIEF SUMMARY OF THE INVENTION

A semiconductor integrated circuit device according to a first aspect of the present invention comprises a cell well, a memory cell array formed on the cell well and having a memory cell area and cell well contact area, first wiring bodies arranged in the memory cell area, and second wiring bodies arranged in the cell well contact area, the layout pattern of the first wiring bodies being the same as the layout pattern of the second wiring bodies.

A semiconductor integrated circuit device according to a second aspect of the present invention comprises a cell well, first wirings, second wirings which intersect with the first wirings, third wirings arranged parallel to the second wirings, transistors arranged at intersections between the first and second wirings and each having the cell well as a backgate thereof, dummy transistors arranged at intersections between the first and third wirings and each having the cell well as a backgate thereof, one of source and drain portions thereof being set to have the same conductivity type as that of the cell well, first contacts respectively connected to the second wirings and corresponding ones of the source and drain portions of the transistors, and second contacts respectively connected to the third wirings and corresponding ones of the source and drain portions of the dummy transistors. A semiconductor integrated circuit device according to a third aspect of the present invention comprises a cell well, a first wiring, a plurality of second wirings which intersect with the first wiring, a plurality of third wirings arranged parallel to the second wirings, a plurality of first transistors arranged at intersections between the first wiring and the plurality of second wirings and having the cell well as backgates thereof, a plurality of dummy transistors arranged at intersections between the first wirings and the plurality of third wirings and having the cell well as backgates thereof, one of source and drain portions thereof being set to have the same conductivity type as that of the cell well, a plurality of first contacts respectively connected to the plurality of second wirings and to corresponding ones of the source and drain portions of the plurality of transistors, and a plurality of second contacts respectively connected to the plurality of third wirings and to corresponding ones of the source and drain portions of the plurality of dummy transistors.

BRIEF DESCRIPTION OF THE SEVERAL VIEWS OF THE DRAWING

FIG. 11 is a view showing an advantage attained in the embodiment of this invention;

DETAILED DESCRIPTION OF THE INVENTION

One of the important factors when a semiconductor integrated circuit device is miniaturized is the lithography technology. It becomes possible to transfer a fine pattern onto the semiconductor integrated circuit device by enhancing the resolution of the lithography technology. In order to enhance the resolution, it is important to pay much attention to the lithography technology itself, for example, the condition of illumination and formation of a photomask.

Further, it is also important to pay much attention to the semiconductor integrated circuit device itself by providing a layout pattern which can be easily resolved. For example, if the repetitive arrangement of bit lines and word lines is lost and the repetitive arrangement of block selection lines, cell source lines and floating gate layers is lost when they are used, a problem which obstructs the development of the fine patterning technique may occur. The present embodiment relates to the technique for improving the semiconductor integrated circuit device itself.

There will now be described one embodiment of this invention with reference to the accompanying drawings. In this explanation, common reference symbols are attached to like portions throughout the drawings.

Figure 1:
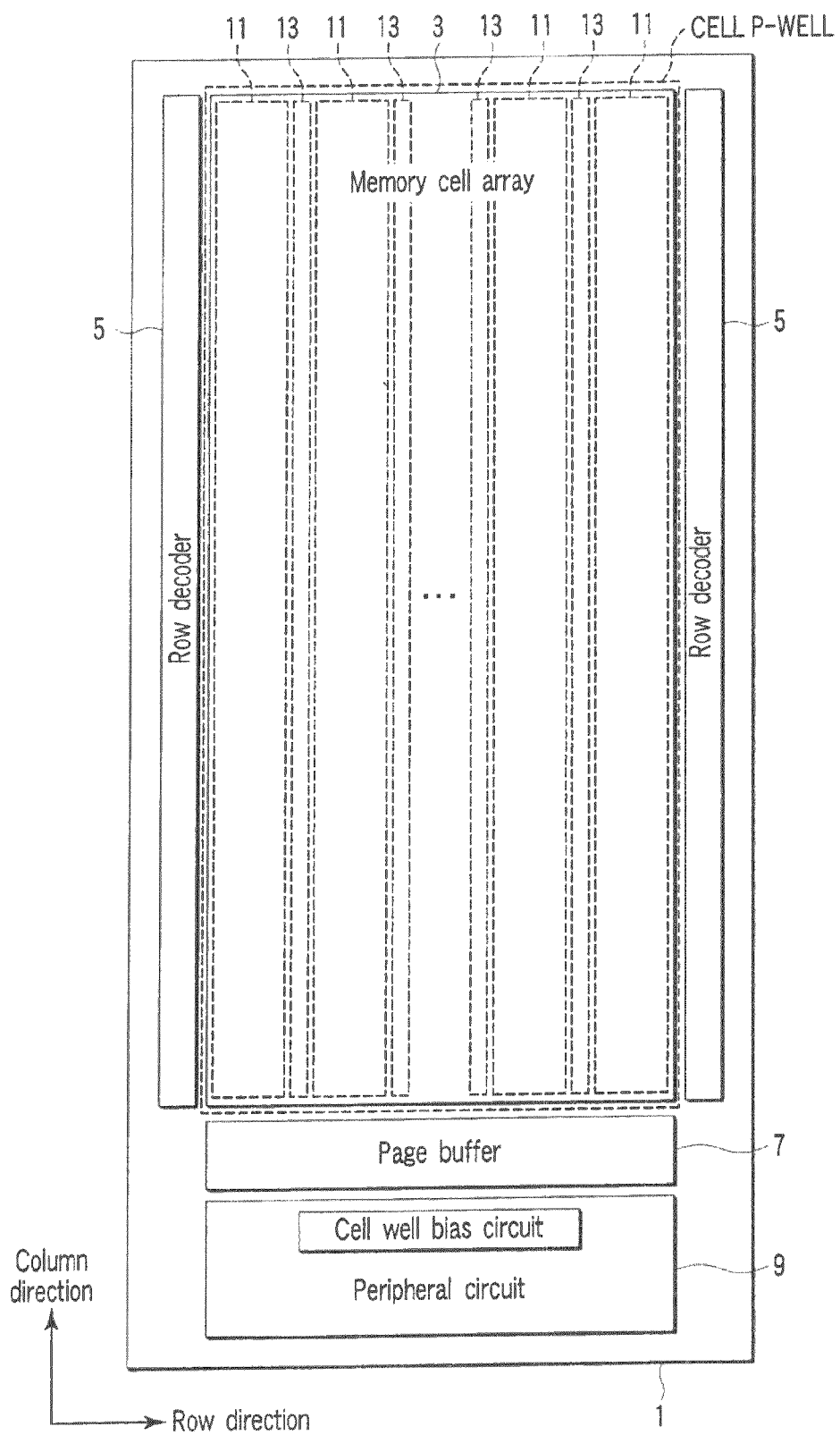
FIG. 1 is a plan view showing an example of the layout of a semiconductor integrated circuit device according to one embodiment of this invention.

FIG. 1 is a plan view showing an example of the layout of a semiconductor integrated circuit device according to one embodiment of this invention. In this example, a semiconductor memory such as a NAND flash memory is shown as one example of a semiconductor integrated circuit device.

As shown in FIG. 1, a main cell array 3, row decoders 5, page buffer 7 and peripheral circuit 9 are mainly arranged on a semiconductor chip 1.

Memory cell transistors are arranged in a matrix form in the memory cell array 3. The row decoder 5 selects a row of the memory cell array 3 according to an address signal. The page buffer 7 holds write data of one page supplied from the exterior, for example, at the write operation time and supplies the thus held write data to a selected page of the memory cell array 3. Further, it holds read data of one page read from the memory cell array 3 at the read operation time and supplies the thus held readout data to the exterior, for example. In the peripheral circuit 9, memory peripheral circuits such as a command decoder, booster circuit and cell well bias circuit are arranged.

The memory cell array 3 of this example is formed on a cell well, for example, P-type cell well (CELL P-WELL). In the memory cell array 3, memory cell areas 11 and cell well contact areas 13 are set. A plurality of memory cell areas 11 and a plurality of cell well contact areas 13 are alternately arranged, for example.

(Circuit Example)

Figure 2:
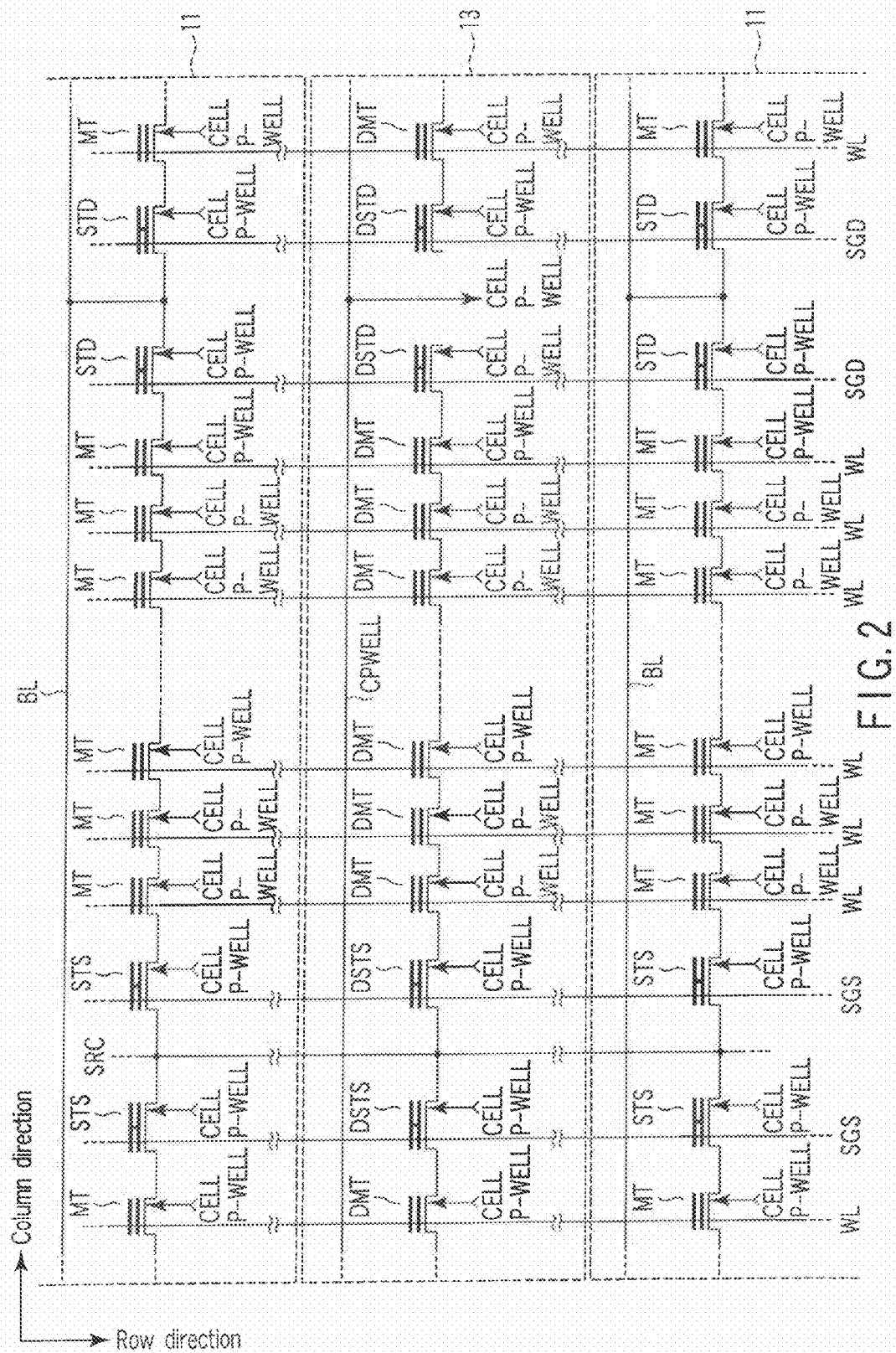
FIG. 2 is a circuit diagram showing a circuit example of a memory cell array 3 shown in FIG. 1.

FIG. 2 is a circuit diagram showing a circuit example of the memory cell array 3 shown in FIG. 1.

As shown in FIG. 2, memory cell transistors MT, source-side block selection transistors STS and drain-side block selection transistors STD are arranged in the memory cell area 11. The transistors MT, STS, STD are formed on the cell well (CELL P-WELL) and the backgates thereof are connected to the cell well (CELL P-WELL).

Further, in the cell well contact area 13, dummy memory cell transistors DMT, dummy source-side block selection transistors DSTS and dummy drain-side block selection transistors DSTD are arranged. The dummy transistors DMT, DSTS, DSTD are formed on the cell well (CELL P-WELL) and the backgates thereof are connected to the cell well (CELL P-WELL) like the transistors MT, STS, STD. The structure of the dummy transistors DMT, DSTS is the same as that of the transistors MT, STS. Further, the structure of the dummy transistor DSTD is similar to that of the transistor STD except that the conductivity type of one of the source and drain portions is the same as that of the cell well (CELL P-WELL). The dummy transistors DMT, DSTD, DSTS are not used as the memory cells and block selection transistors.

Bit lines BL are arranged in the column direction in the memory cell area 11 and connected to corresponding ones of the source and drain portions of the transistors STD.

A cell well bias line CPWELL is arranged parallel to the bit lines BL in the cell well contact area and connected to the cell well (CELL P-WELL). In this example, the bias line is connected to the cell well (CELL P-WELL) via one of the source and drain portions of the dummy transistor DSTD. The conductivity type of one of the source and drain portions of the dummy transistor DSTD is the same as that of the cell well (CELL P-WELL). In this example, for example, it is of a P type. The cell well bias line CPWELL is a wiring which applies bias potential to the cell well (CELL P-WELL). The bias potential is generated from the cell well bias circuit. The cell well (CELL P-WELL) is biased to low potential (for example, 0V) via the cell well bias line CPWELL at the readout operation time and write operation time. Further, at the erase operation time, it is biased to high potential (for example, 20V) via the cell well bias line CPWELL.

Cell source lines SRC are arranged in the row direction to cross the memory cell areas 11 and cell well contact areas 13. The column direction is a direction which intersects with the row direction and, for example, the column direction intersects with the row direction at right angles. The cell source line SRC is connected to one of the source and drain portions of the transistors STS and one of the source and drain portions of the dummy transistors DSTS.

The transistors MT are serially connected between the other one of the source and drain portions of the transistor STD and the other one of the source and drain portions of the transistor STS. Likewise, the dummy transistors DMT are serially connected between the other one of the source and drain portions of the dummy transistor DSTD and the other one of the source and drain portions of the dummy transistor DSTS.

The control gates of the transistors MT and the control gates of the dummy transistors DMT which are arranged on the same row are commonly connected and function as a word line WL.

Likewise, the gates of the transistors STS and the gates of the dummy transistors DSTS which are arranged on the same row are commonly connected and function as a source-side block selection line SGS.

Also, the gates of the transistors STD and the gates of the dummy transistors DSTD which are arranged on the same row are commonly connected and function as a drain-side block selection line SGS.

(Example of Structure)

Figure 3:
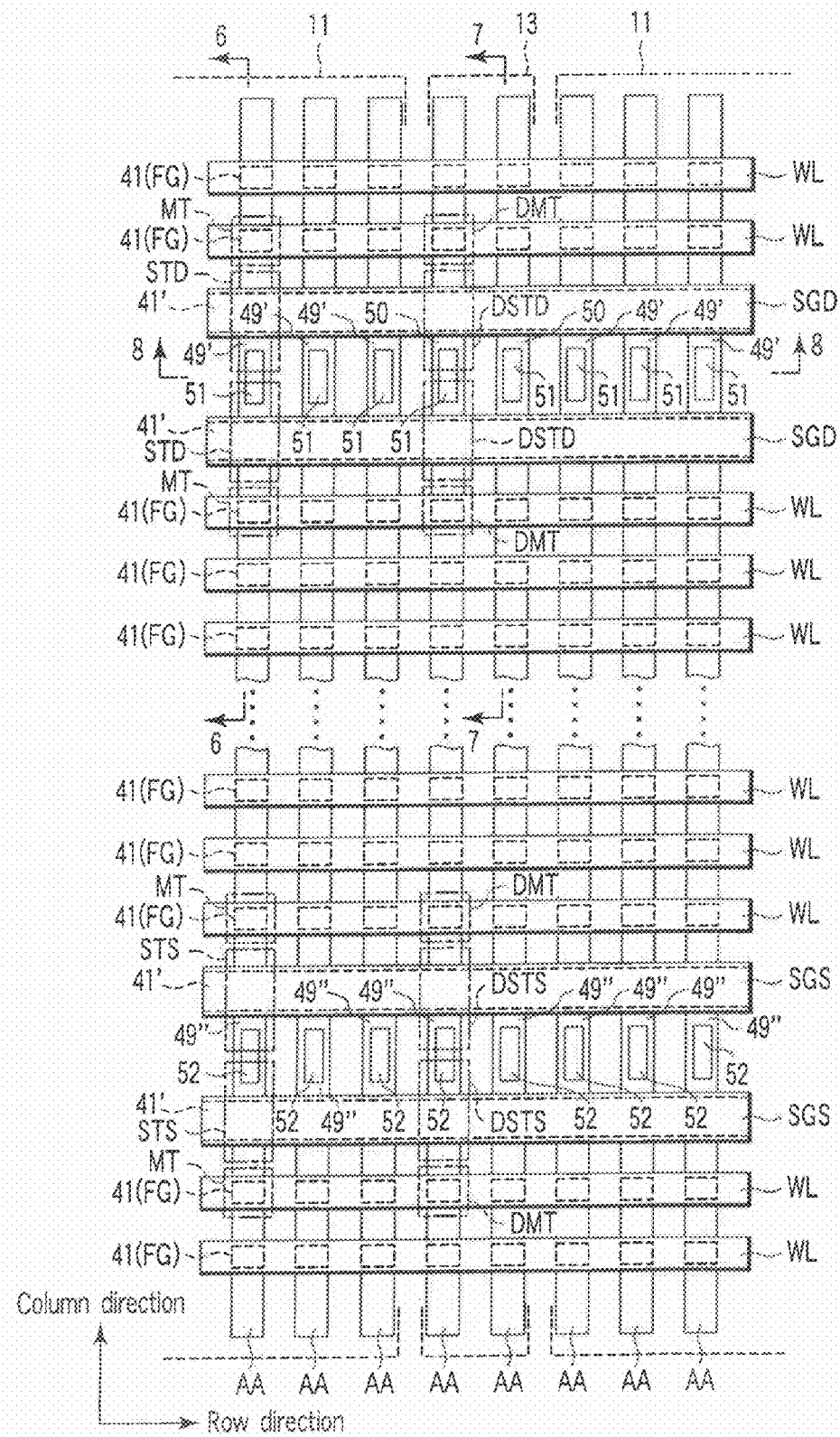
FIG. 3 is a plan view showing an example of a gate layout pattern of the memory cell array 3 shown in FIG. 1.
Figure 4:
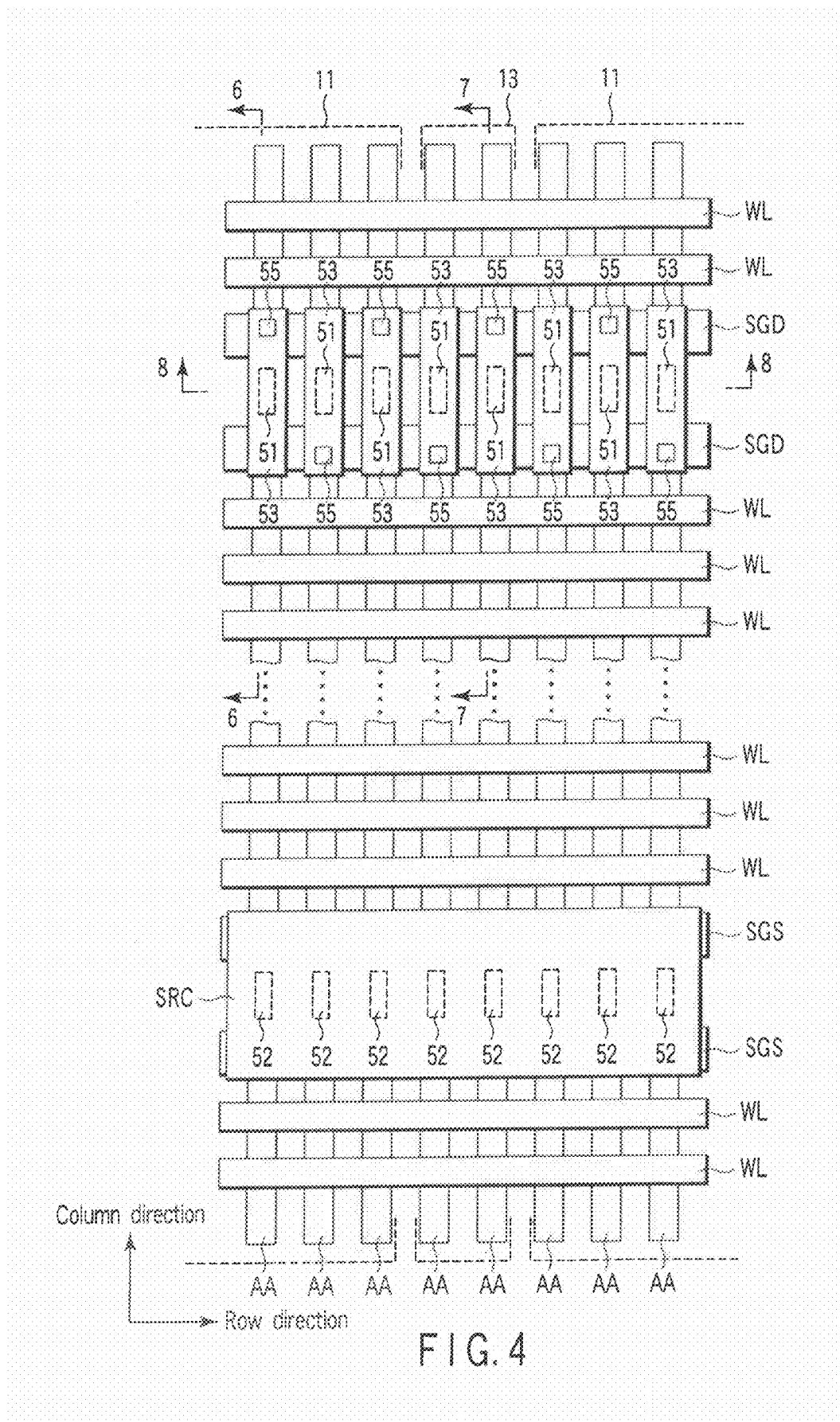
FIG. 4 is a plan view showing an example of a first-layered metal layout pattern of the memory cell array 3 shown in FIG. 1.
Figure 5:
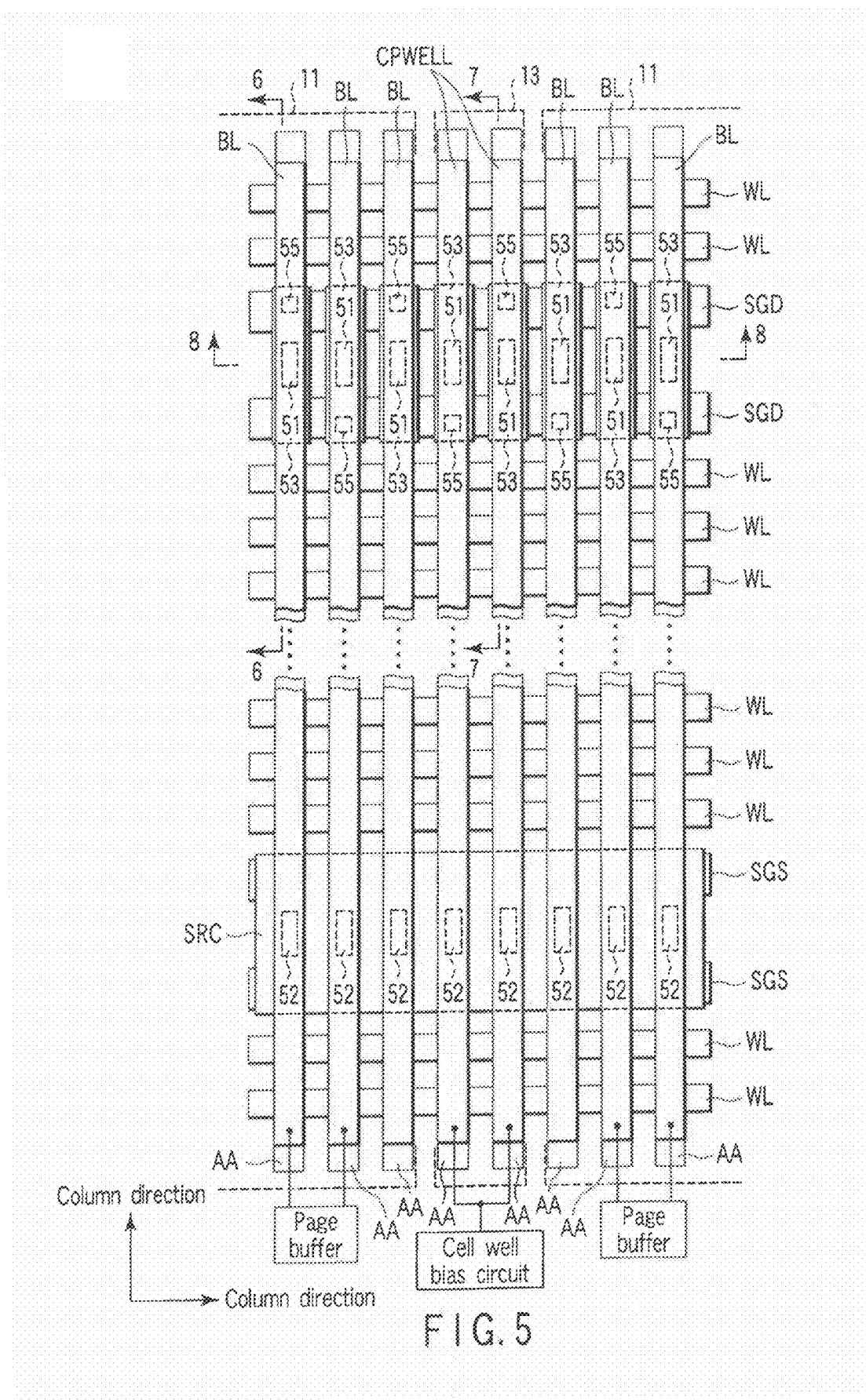
FIG. 5 is a plan view showing an example of a second-layered metal layout pattern of the memory cell array 3 shown in FIG. 1.
Figure 6:
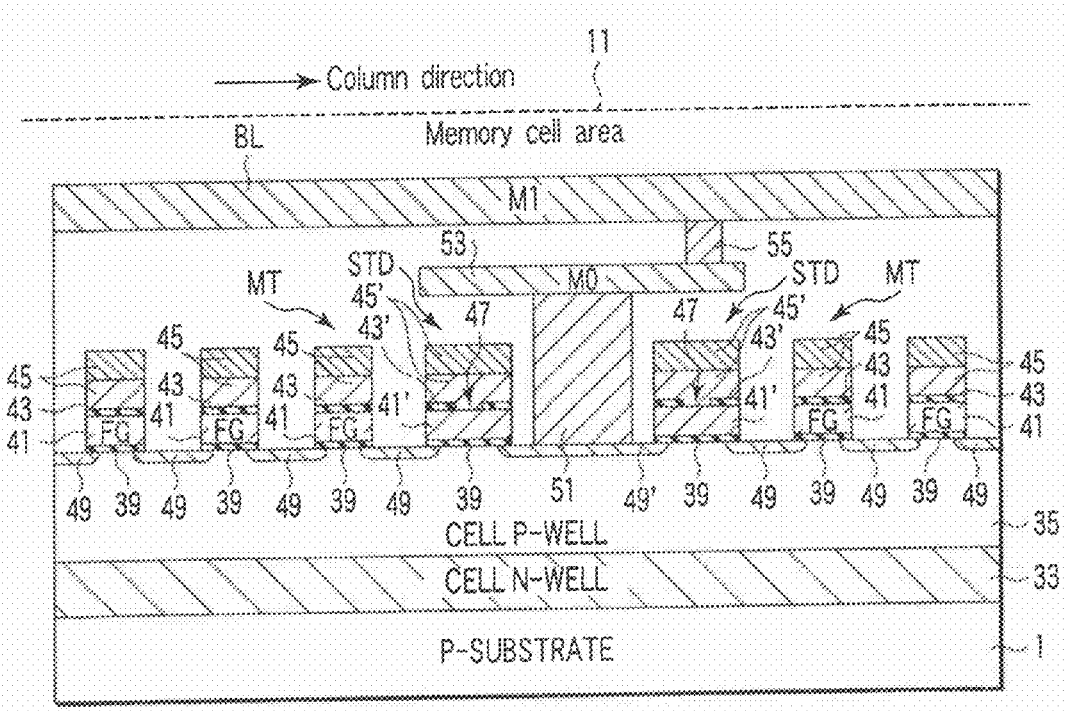
FIG. 6 is a cross-sectional view taken along the 6-6 line in FIGS. 3 to 5.

FIGS. 3 to 5 plan views each showing an example of the structure of the memory cell array 3 shown in FIG. 1. FIG. 3 shows an example of a gate layout pattern, FIG. 4 shows an example of a first-layered metal (M0) layout pattern and FIG. 5 shows an example of a second-layered metal (M1) layout pattern. Further, FIG. 6 is a cross-sectional view taken along the 6-6 line in FIGS. 3 to 5, FIG. 7 is a cross sectional view taken along the 7-7 line in FIGS. 3 to 5 and FIG. 8 is a cross sectional view taken along the 8-8 line in FIGS. 3 to 5.

As shown in FIGS. 3 to 8, for example, an N-type cell well (CELL N-WELL) 33 and P-type cell well (CELL P-WELL) 35 are formed in a P-type semiconductor substrate (P-SUBSTRATE) such as a P-type silicon substrate 1. The cell well 33 electrically isolates the cell well 35 from the substrate 1.

In the surface area of the substrate 1 (in the surface area of the cell well 35 in FIGS. 3 to 8), element isolation insulating films 37 are formed. One example of the element isolation insulating film 37 is a shallow trench isolation (STI) region. The element isolation insulating films 37 isolate active regions AA in the surface region of the substrate 1 (in the surface area of the cell well 35 in FIGS. 3 to 8). In this example, the layout pattern of the active regions AA of the memory cell area 11 is the same as the layout pattern of the active regions AA of the cell well contact area 13.

On each of the active regions AA, a gate insulating film 39 is formed. One example of the gate insulating film 39 is a silicon dioxide film. On each gate insulating film 39, a floating gate (FG) 41 is formed. One example of the floating gate is a conductive polysilicon film. On each floating gate 41, a gate-gate insulating film 43 is formed. One example of the gate-gate insulating film 43 is a three-layered film (ONO film) of a silicon nitride film/silicon dioxide film/silicon nitride film. On each gate-gate insulating film 43, a control gate 45 is formed.

One example of the control gate 45 is a laminated film (polycide film) of a conductive polysilicon film and metal silicide film.

The gate electrode of each of the memory cell transistors MT and dummy memory cell transistors DMT has a laminated structure of the floating gate 41, gate-gate insulating film 43 and control gate 45. Each control gate 45 is commonly used by the transistors MT and dummy transistors DMT arranged in the row direction and functions as the word line WL.

The gate electrode of each of the block selection transistors STD (or STS) and dummy block selection transistors DSTD (or DSTS) has a laminated structure of a conductive film 41' which is the same as the floating gate 41, an insulating film 43' which is the same as the gate-gate insulating film 43 and a conductive film 45' which is the same as the control gate 45. The insulating film 43' of this example has an opening 47 and the conductive film 45' is electrically connected to the conductive film 41' via the opening 47. In this example, the conductive films 41' and 45' are commonly used by the transistors STD (or STS) and dummy transistors DSTD (or DSTS) which are arranged in the row direction and function as drain-side block selection lines SGD (or source-side block selection lines SGS).

Thus, in this example, the layout pattern of the gates arranged in the memory cell area 11 is the same as the layout pattern of the gates arranged in the cell well contact area 13.

N-type source/drain diffusion layers 49 are formed in portions of the active regions AA which lie under between the gate electrodes of the transistors MT. Further, N-type source/drain diffusion layers 49 are also formed in portions of the active regions AA which lie under between the gate electrodes of the transistors MT and the gate electrodes of the transistors STD (or STS), between the gate electrodes of the dummy transistors DMT and between the gate electrodes of the dummy transistors DMT and the gate electrodes of the dummy transistors DSTD (or DSTS).

N-type source/drain diffusion layers 49' are formed in portions of the active regions AA which lie under between the gate electrodes of the transistors STD.

Further, P-type diffusion layers 50 having the same conductivity type as the cell well 35 are formed in portions of the active regions AA which lie under between the gate electrodes of the dummy transistors DSTD.

In addition, N-type source/drain diffusion layers 49" are formed in portions of the active regions AA which lie under between the gate electrodes of the transistors STS and between the gate electrodes of the dummy transistors DSTS.

The N-type source/drain diffusion layers 49' and P-type diffusion layers 50 are connected to respective plugs 51. Further, the N-type source/drain diffusion layers 49" are connected to respective plugs 52. One example of the plugs 51, 52 is a metal film. As an example of the metal film, a titanium film and tungsten film are used. In this example, the layout pattern of the plugs 51, 52 arranged in the memory cell area 11 is the same as the layout pattern of the plugs 51, 52 arranged in the cell well contact area 13.

The plugs 51 are connected to respective local internal wirings 53. One example of the local internal wiring 53 is a metal film. As an example of the metal film, an aluminum film and copper film are used.

The plugs 52 are connected to respective cell source lines SRC. One example of the cell source line SRC is a metal film. As an example of the metal film, an aluminum film and copper film are used. In this example, the cell source line SRC is formed on the same plane as the local internal wiring 53. For example, these wirings are formed by use of the same conductive film, for example, a first-layered metal (M0). Further, in this example, the layout pattern of the first-layered metal (M0) arranged in the memory cell area 11 is the same as the layout pattern of the first-layered metal (M0) arranged in the cell well contact area.

The local internal wirings 53 are connected to respective plugs 55. In this example, the layout pattern of the plugs 55 arranged in the memory cell area 11 is the same as the layout pattern of the plugs 55 arranged in the cell well contact area 13.

Figure 8:
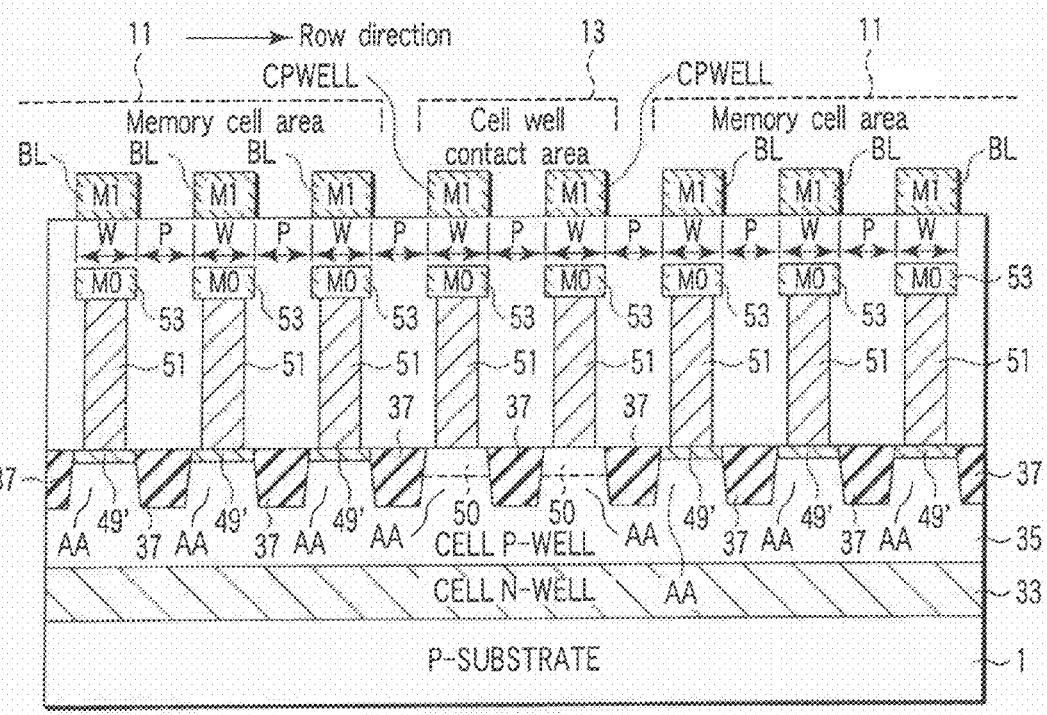
FIG. 8 is a cross-sectional view taken along the 8-8 line in FIGS. 3 to 5.

The plugs 55 arranged in the memory cell area 11 are connected to the bit line BL. The plugs 55 arranged in the cell well contact area 13 are connected to the cell well bias line CPWELL. In this example, the bit line BL and cell well bias line CPWELL are formed by use of the same conductive film, for example, a second-layered metal (M1). Further, in this example, as shown in FIG. 8, the width of the bit line BL in the row direction is the same as the width W of the cell well bias line CPWELL in the row direction. Further, the arrangement pitch of the bit lines BL is the same as the arrangement pitch P of the cell well bias lines CPWELL. That is, in this example, the layout pattern of the bit lines BL is the same as the layout pattern of the cell well bias lines CPWELL.

In the semiconductor integrated circuit device according to the present embodiment of this invention, the layout pattern of the physical structure arranged in the memory cell array 3 is the same in the memory cell area 11 and in the cell well contact area 13. Therefore, the repetitive form of the physical structure can be maintained in the cell well contact area 13 and the repetitive form thereof can be constantly attained in the entire portion of the memory cell array 3. For example, the physical structure includes the bit lines BL, word lines WL, block selection lines SGS, SGD and cell well bias lines CPWELL in the case of NAND flash memory.

One advantage of the semiconductor integrated circuit device according to the present embodiment of this invention is explained with reference to FIGS. 9 and 10.

One of the advantages is that the dummy area can be reduced or eliminated in the memory cell array 3.

Figure 9A:
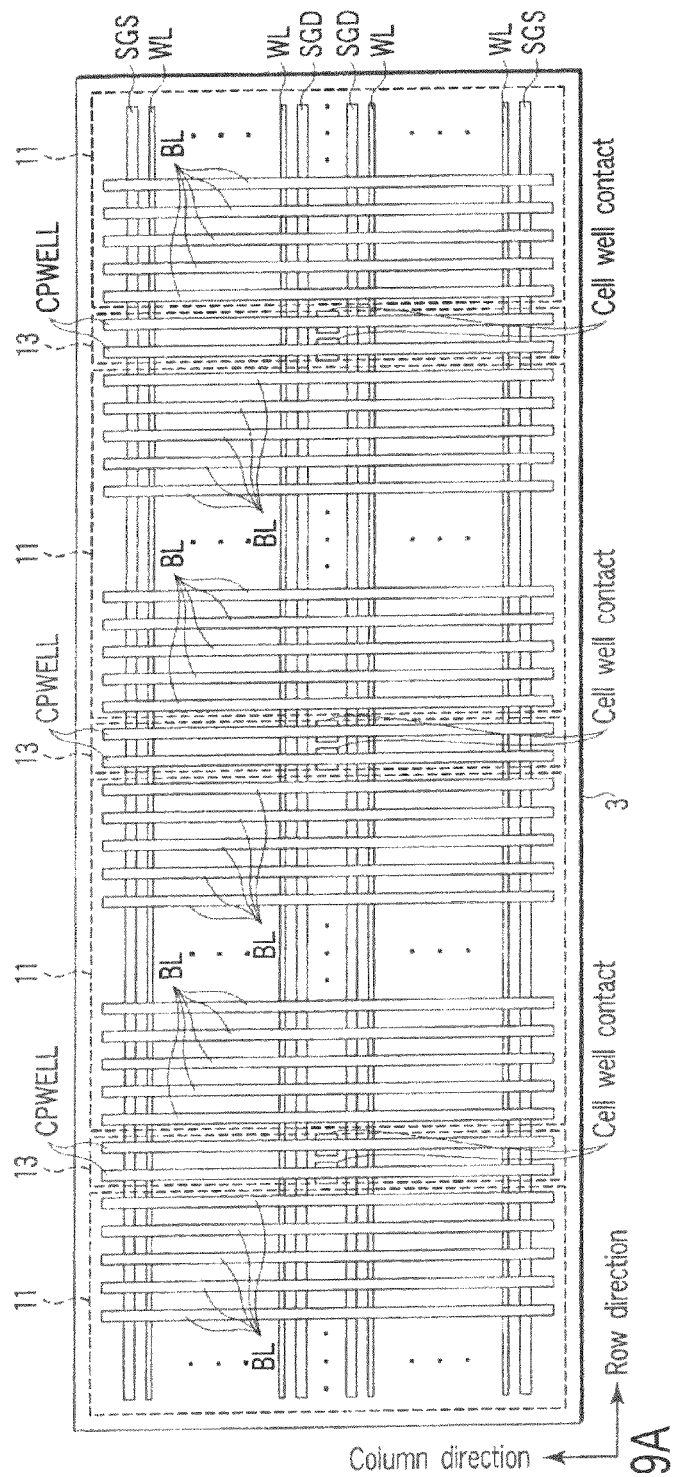
FIG. 9A is a plan view showing a memory cell array of a semiconductor integrated circuit device according to the embodiment of this invention.
Figure 10A:
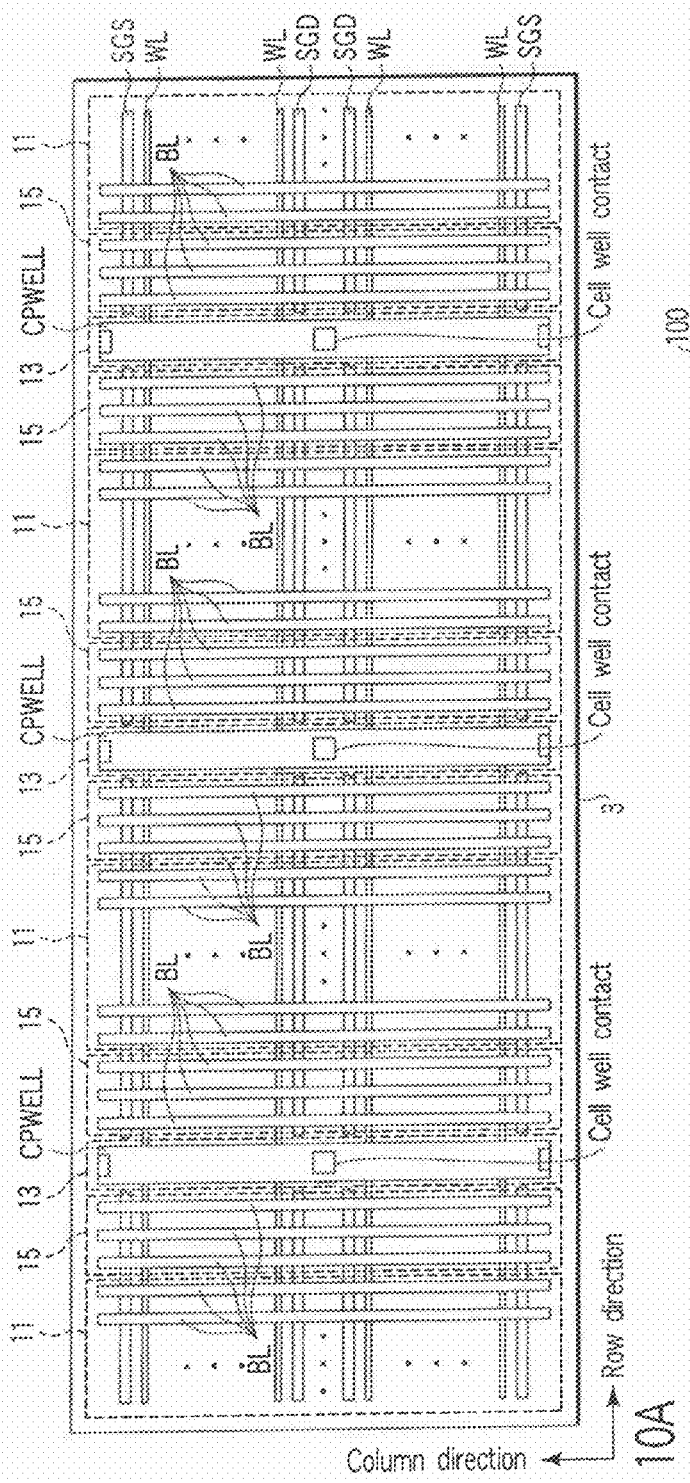
FIG. 10A is a plan view showing a memory cell array of a semiconductor integrated circuit device according to a reference example of this invention.
Figure 10B:
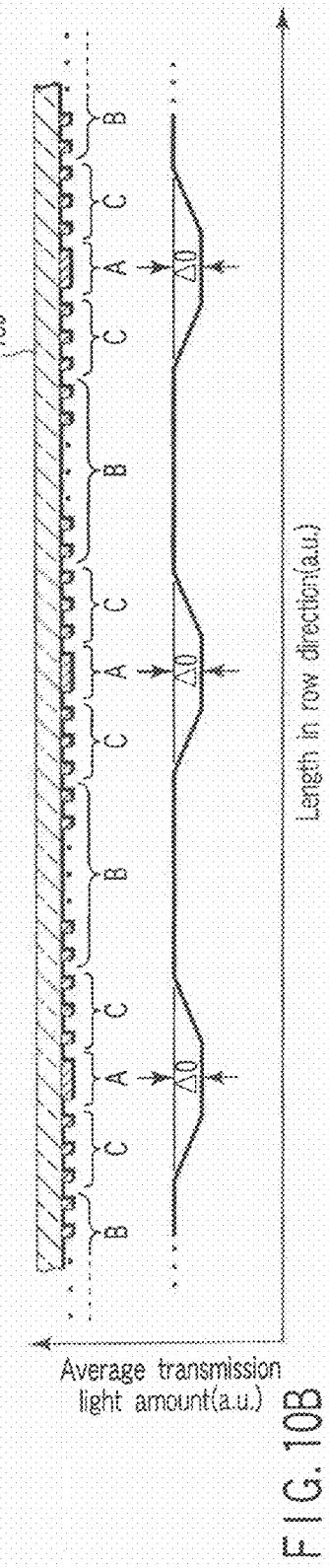
FIG. 10B is a diagram showing an average transmission light amount of a photomask.

FIG. 9A is a plan view showing the memory cell array of the semiconductor integrated circuit device according to the embodiment of this invention and showing a layout pattern of bit lines and cell well bias lines. FIG. 10A is a plan view showing a memory cell array of a semiconductor integrated circuit device according to a reference example of this invention and showing a layout pattern of bit lines and cell well bias lines.

As shown in FIG. 9A, according to the present embodiment, the layout pattern of the bit lines BL and cell well bias lines CPWELL is the same in the memory cell area 11 and in the cell well contact area 13. Therefore, the repetitive form of the layout pattern of the bit lines BL and cell well bias lines CPWELL is constant in the entire portion of the memory cell array 3.

On the other hand, as shown in FIG. 10A, in the reference example, for example, in a device disclosed in Jpn. Pat. Appln. KOKAI Publication No. 2000-91546, the repetitive form of the layout pattern of the bit lines BL and cell well bias lines CPWELL cannot be maintained in the cell well contact area 13 since the width of the cell well bias line CPWELL is larger than the width of the bit line BL.

The above problem makes it difficult to uniformly subject the bit lines BL to a lithography process. One of the reasons is that the ratio of the light transmission portion/light shielding portion becomes different in a cell well bias line pattern portion A and in a bit line pattern portion B of a photomask 100 as shown in FIG. 10A. The width of the cell well bias line pattern is large and the light shielding portion is larger. Therefore, the light shielding portion is dense. On the other hand, the width of the bit line pattern is small and the light shielding portion is less. Therefore, the light shielding portion is coarse. The difference in the density causes a difference Δ0 between the average amount of transmission light which passes through the portion A and the average amount of transmission light which passes through the portion B. Due to the difference Δ0, a portion C in which the average transmission light amount is changed occurs between the portions A and B. In the portion C, not the cell well bias line pattern but the bit line pattern is formed as in the portion B. However, since the average amount of transmission light which passes through the portion C and the neighboring portion thereof is different from the average amount of transmission light which passes through the portion B and the neighboring portion thereof, the widths of the bit liens BL formed are different. For example, since the bit line capacitances are different if the widths of the bit lines BL are different, a variation in the read speed and write speed between the bit lines becomes larger in the semiconductor memory. This lowers the performance of the semiconductor memory. Therefore, it is common practice to form the bit line pattern in the portion C and set the portion as an area (dummy area) 15 which is not used as a memory in the actual device as shown in FIG. 10A.

Figure 9B:
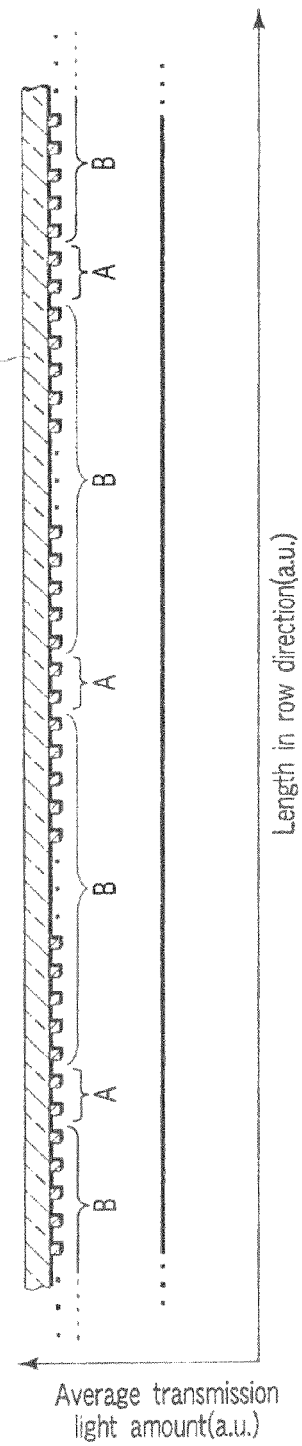
FIG. 9B is a diagram showing an average transmission light amount of a photomask.

On the other hand, according to the present embodiment, the width of the cell well bias line CPWELL is the same as that of the bit line BL and the arrangement pitches thereof are constant. Therefore, as shown in FIG. 9B, the ratio of the light transmission portion/light shielding portion becomes constant in the cell well bias line pattern portion A and in the bit line pattern portion B of the photomask 100. As a result, the average transmission light amount through the portion A becomes the same as the average transmission light amount through the portion B and the portion C in which the average transmission light amount varies as shown in the reference example does not occur. Therefore, the dummy area 15 can be reduced or eliminated in the memory cell array 3.

Thus, if the dummy area 15 can be reduced or eliminated, an advantage that the area of the memory cell array 3 can be reduced can be attained in a case where the memory capacity is kept constant as shown in FIG. 11.

Figure 12:
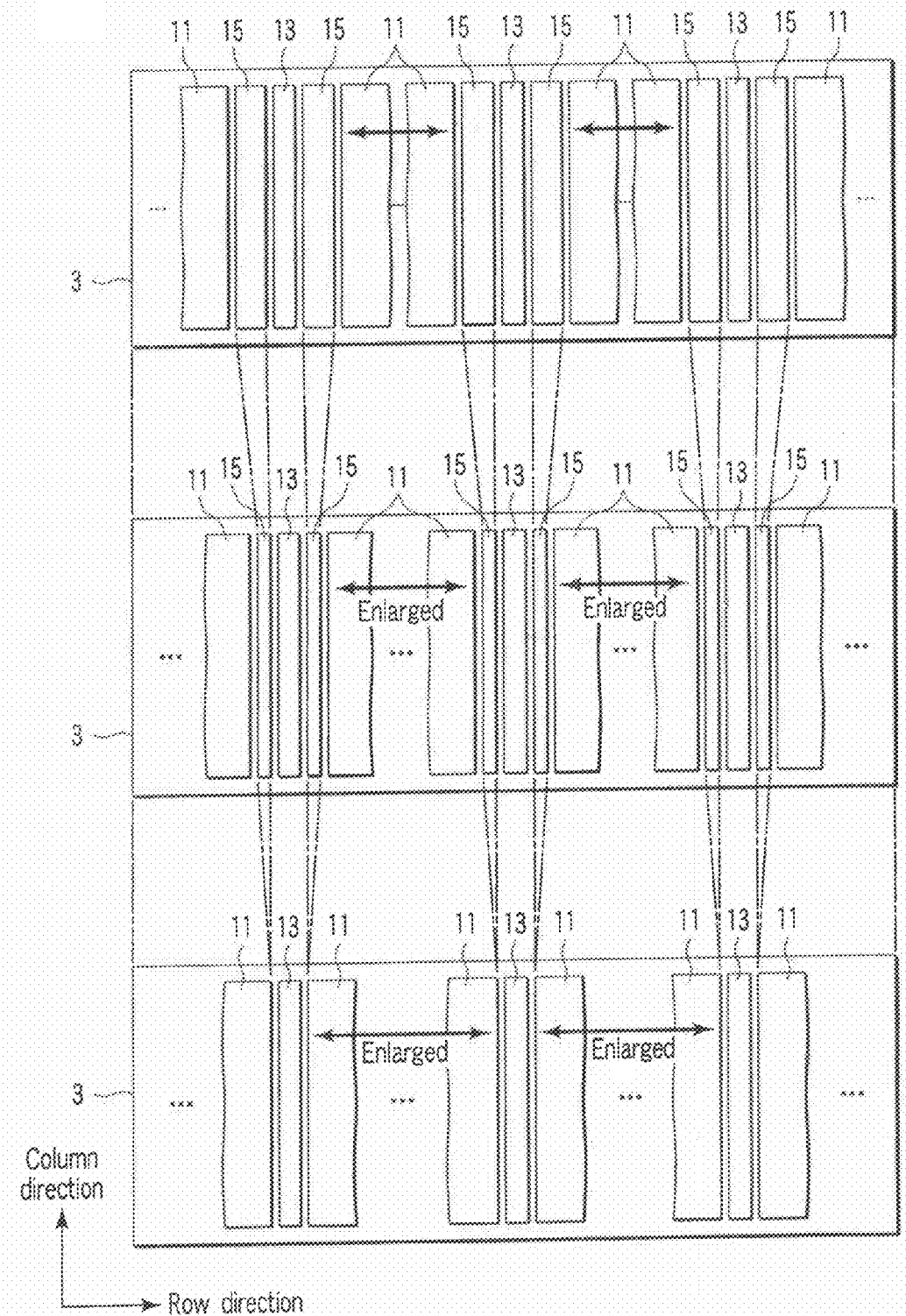
FIG. 12 is a view showing an advantage attained in the embodiment of this invention.

Further, as shown in FIG. 12, in a case where the area of the memory cell array 3 is kept constant, an advantage that the memory capacity can be increased since the memory cell area 11 can be increased can be attained.

Therefore, according to the present embodiment, a semiconductor memory in which the memory cell array 3 can be easily miniaturized and can be integrated with high integration density can be provided.

When it is desired to increase the capacity of the cell well bias line CPWELL or lower the resistance thereof, the cell well bias circuit may be connected to a plurality of cell well bias lines as in the present embodiment. For example, in the present embodiment, the cell well bias circuit is connected to two cell well bias lines CPWELL for each cell well contact area 13.

Next, some of the devices which maintain the repetitive form in the semiconductor integrated circuit device according to the embodiment of this invention.

(Cell Well Contact)

In the present embodiment, dummy transistors for cell well contacts are provided below the cell well bias lines CPWELL. The contact dummy transistor has a P-type source/drain portion 50 having the same conductivity type as a P-type cell well 35. In the present embodiment, the contact dummy transistor is the dummy block selection transistor DSTD shown in FIG. 7. A connection (cell well contact) between the cell well bias line CPWELL and the cell well 35 is made via the P-type source/drain portion 50.

Thus, it is not necessary to form a particular pattern in the cell well contact as shown in the reference example of FIG. 10A, for example, by utilizing the source/drain portion of the transistor.

Therefore, the gate layout pattern of the cell well contact area 13 can be set to the same as the gate layout pattern of the memory cell area 11.

For example, the P-type source/drain portion 50 can be formed as follows.

First, like the other transistors, an N-type source/drain portion is formed in the source/drain portion of the contact dummy transistor. After this, for example, P-type impurity is doped into the source/drain portion of the contact dummy transistor to change the conductivity type of the N-type source/drain portion to a P conductivity type.

Further, in the present embodiment, transistors are provided below the bit lines. The transistor has an N-type source/drain portion 49' having a conductivity type different from that of the P-type cell well 35. In the present embodiment, the transistor is the block selection transistor STD shown in FIG. 6.

The bit line BL is connected to the N-type source/drain portion 49' of the transistor via a connection member. In the present embodiment, the connection member is the plug 51. The cell well bias line is connected to the P-type source/drain portion 50 of the contact dummy transistor via a connection member. In the present embodiment, the connection member is the plug 51. In the present embodiment, the plugs 51 are aligned in the row direction as shown in FIG. 3.

Thus, if the plugs 51 are aligned in the row direction, the layout pattern of the plugs 51 of the cell well contact area 13 can be formed as the same pattern as the layout pattern of the plugs 51 of the memory cell area 11.

Conventionally, doped polysilicon, for example, N-type doped polysilicon having the same conductivity type as the N-type source/drain portion 49' may be used to form the plug 51 in some cases. However, in the present embodiment, the N-type portion 49' and P-type portion 50 are provided in the source/drain portion. Therefore, if doped polysilicon is used to form the plug 51, PN junction may be made between the plug 51 and the source/drain portion in some cases. In order to prevent formation of the PN junction, for example, metal may be used to form the plug 51 as described before. One example of the metal is titanium or tungsten as described before.

(Block Selection Line)

Generally, the block selection line is shunted by use of another conductive layer in order to lower the resistance thereof. For this purpose, it becomes necessary to provide a block selection contact area in which the other conductive layer is connected to the block selection line. Due to the presence of the contact area, the repetitive form of the layout pattern in the memory cell array 3 cannot be maintained.

Figure 7:
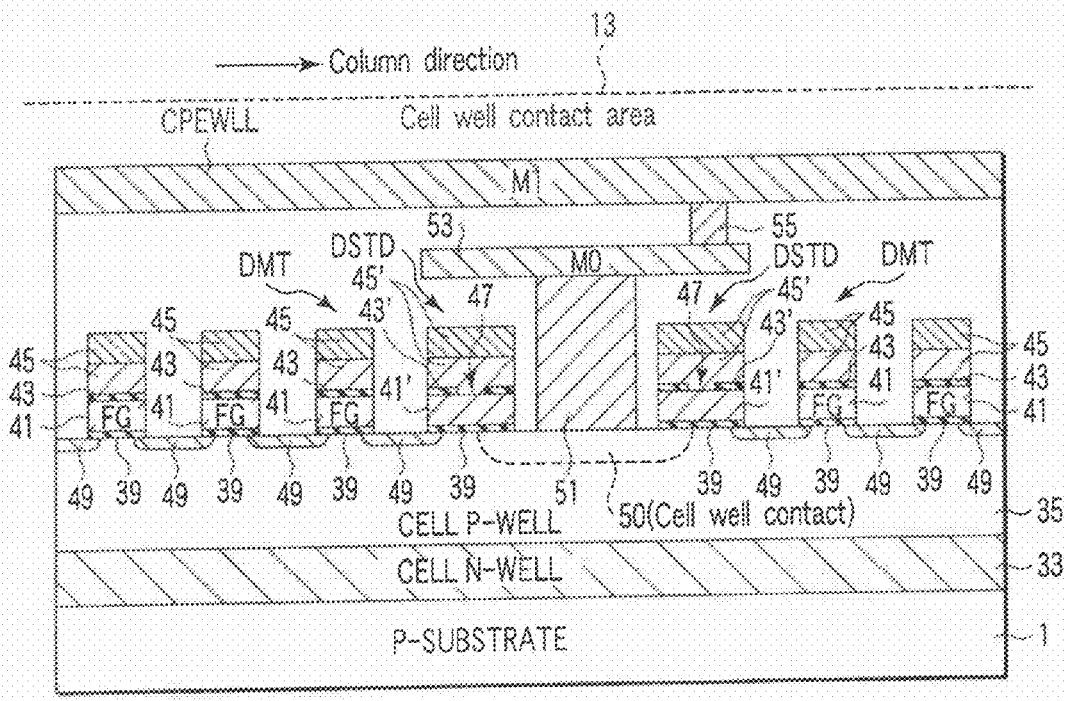
FIG. 7 is a cross-sectional view taken along the 7-7 line in FIGS. 3 to 5.

In the present embodiment, there is no block selection line contact area. Instead of this, for example, a conductive film 45' formed by use of the same conductive material as the control gate 45 is connected to a conductive layer 41' formed by use of the same material as the charge storage layer 41 (FG). As shown in FIGS. 6 and 7, the connection is made by use of an opening 47 formed in the conductive layer 43'.

Thus, the resistance of the block selection line can be lowered by connecting the conductive film 45' to the conductive layer 41'. In this case, it is not necessary to provide the block selection line contact area in the memory cell array 3 by making the connection by use of the opening 47 formed in the insulating film 43'.

Thus, according to this embodiment, when an attempt is made to lower the resistance of the block selection line, the repetitive arrangement of the layout pattern of the memory cell array 3 can be maintained.

Figure 13:
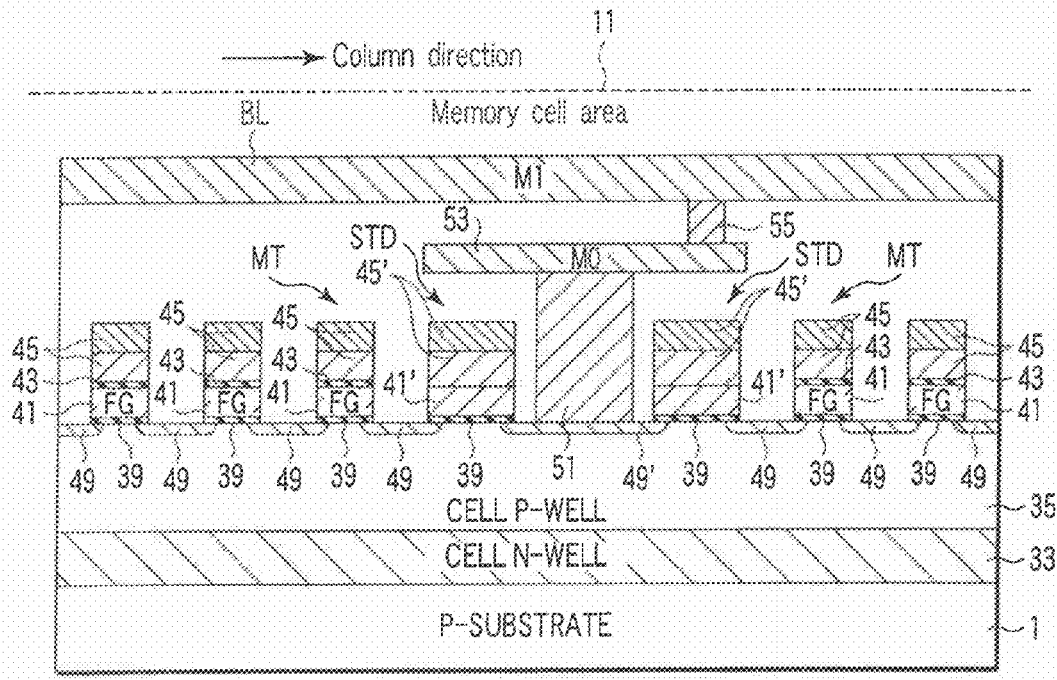
FIG. 13 is a cross-sectional view showing a semiconductor integrated circuit device according to a modification of the embodiment.
Figure 14:
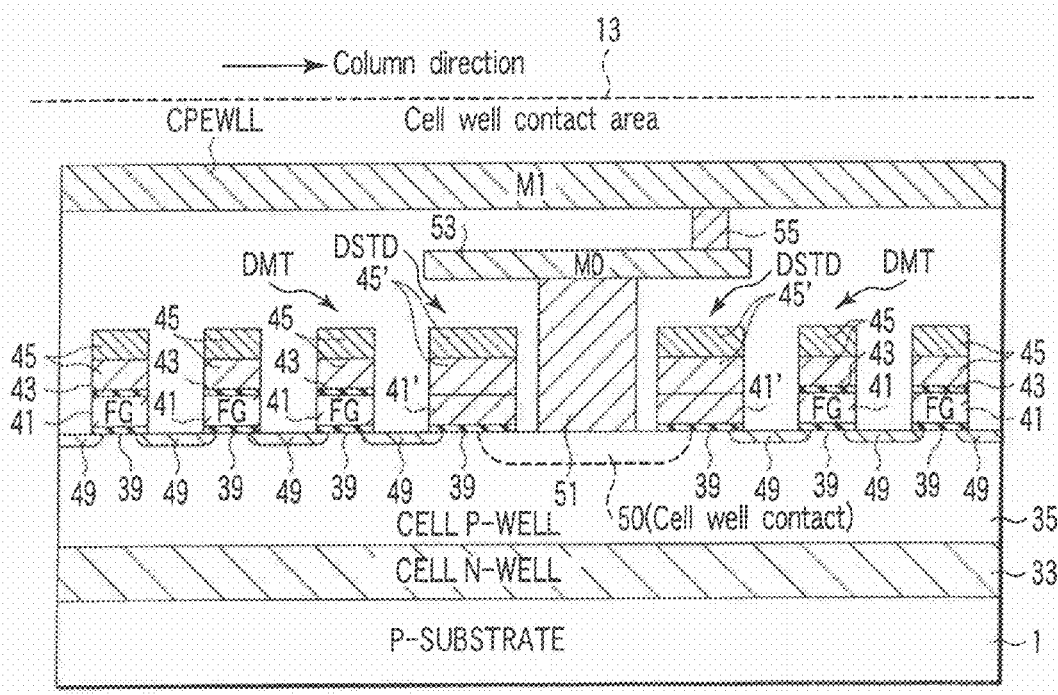
FIG. 14 is a cross-sectional view showing a semiconductor integrated circuit device according to another modification of the embodiment.

As shown in FIGS. 13 and 14, the connection between the conductive layer 41' and the conductive film 45' can be attained by eliminating the insulating film 43' and setting the upper surface of the conductive layer 41' in contact with the undersurface of the conductive film 45' without forming the opening 47. FIG. 13 corresponds to the cross-sectional view of FIG. 6 and FIG. 14 corresponds to the cross-sectional view of FIG. 7.

This invention is explained by use of the embodiment, but this invention is not limited to the above embodiment and can be variously modified without departing from the technical scope thereof when this invention is embodied. Further, the above embodiment of this invention is not only one embodiment.

In the above embodiment, various stages of this invention are contained and inventions of various stages can be extracted by adequately combining a plurality of constituents disclosed in the respective embodiments.

In the above embodiment, this invention is explained by use of the example in which this invention is applied to the semiconductor integrated circuit device, for example, semiconductor memory, but a semiconductor integrated circuit device such as a processor or system LSI containing a semiconductor memory is contained in the scope of this invention.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A semiconductor integrated circuit device comprising:
a cell well,
first wirings,
second wirings which intersect with the first wirings,
third wirings arranged parallel to the second wirings,
transistors arranged at intersections between the first wirings and the second wirings and having the cell well as backgates thereof,
dummy transistors arranged at intersections between the first wirings and the third wirings and having the cell well as backgates thereof, one of source and drain portions thereof being set to have the same conductivity type as that of the cell well,
first contacts respectively connected to the second wiring and to corresponding ones of the source and drain portions of the transistors, and
second contacts respectively connected to the third wiring and to corresponding ones of the source and drain portions of the dummy transistors.

2. The device according to claim 1, wherein the first and second contacts are formed of metal.

3. The device according to claim 1, wherein the first and second contacts are aligned in the row direction.

4. The device according to claim 1, wherein the first wirings are word lines, the second wirings are bit lines and the third wirings are cell well bias lines.

5. The device according to claim 4, wherein the transistor which is arranged adjacent to the bit line and cell well bias line, connected to the bit line and having the word line as a gate thereof is a memory cell transistor.

6. The device according to claim 1, wherein the first wirings are block selection lines, the second wirings are bit lines and the third wirings are cell well bias lines.

7. The device according to claim 6, wherein the transistor which is arranged adjacent to the bit line and cell well bias line, connected to the bit line and having the block selection line as a gate thereof is a block selection transistor.

8. A semiconductor integrated circuit device comprising:
a cell well,
a first wiring,
a plurality of second wirings which intersect with the first wiring,
a plurality of third wirings arranged parallel to the second wirings,
a plurality of first transistors arranged at intersections between the first wiring and the plurality of second wirings and having the cell well as backgates thereof,
a plurality of dummy transistors arranged at intersections between the first wiring and the plurality of third wirings and having the cell well as backgates thereof, one of source and drain portions thereof being set to have the same conductivity type as that of the cell well,
a plurality of first contacts respectively connected to the plurality of second wirings and to corresponding ones of the source and drain portions of the plurality of transistors, and
a plurality of second contacts respectively connected to the plurality of third wirings and to corresponding ones of the source and drain portions of the plurality of dummy transistors.

9. The device according to claim 8, wherein the first and second contacts are formed of metal.

10. The device according to claim 8, wherein the first wiring is a word line, the plurality of second wirings are bit lines and the plurality of third wirings are cell well bias lines.

11. The device according to claim 10, wherein the plurality of transistors which are arranged adjacent to one of the plurality of bit lines and one of the plurality of cell well bias lines, connected to the plurality of bit lines and each having the word line as a gate thereof are memory cell transistors.

12. The device according to claim 8, wherein the first wiring is a block selection line, the plurality of second wirings are bit lines and the plurality of third wirings are cell well bias lines.

13. The device according to claim 12, wherein the plurality of transistors which are arranged adjacent to one of the plurality of bit lines and one of the plurality of cell well bias lines, connected to the above bit line and having the block selection line as a gate thereof are block selection transistors.

* * * * *